(12) United States Patent
Fitzpatrick et al.

(10) Patent No.: US 10,798,819 B2
(45) Date of Patent: Oct. 6, 2020

(54) FLEXIBLE PRINTED CIRCUIT TO MITIGATE CRACKING AT THROUGH-HOLES

(71) Applicant: COMMSCOPE, INC. OF NORTH CAROLINA, Hickory, NC (US)

(72) Inventors: Brian J. Fitzpatrick, McKinney, TX (US); Jeffrey Cook, Parker, TX (US); Jitendra Hansalia, Murphy, TX (US); Amid Ihsan Hashim, Plano, TX (US)

(73) Assignee: COMMSCOPE, INC. OF NORTH CAROLINA, Hickory, NC (US)

( * ) Notice: Subject to any disclaimer, the term of this patent is extended or adjusted under 35 U.S.C. 154(b) by 0 days.

(21) Appl. No.: 16/346,444

(22) PCT Filed: Oct. 30, 2017

(86) PCT No.: PCT/US2017/059043
§ 371 (c)(1),
(2) Date: Apr. 30, 2019

(87) PCT Pub. No.: WO2018/081710
PCT Pub. Date: May 3, 2018

(65) Prior Publication Data
US 2019/0297728 A1      Sep. 26, 2019

Related U.S. Application Data

(60) Provisional application No. 62/415,076, filed on Oct. 31, 2016.

(51) Int. Cl.
| H05K 1/11 | (2006.01) |
| H05K 1/02 | (2006.01) |
| H05K 3/38 | (2006.01) |
| H05K 3/42 | (2006.01) |

(Continued)

(52) U.S. Cl.
CPC ............. *H05K 1/116* (2013.01); *H05K 1/028* (2013.01); *H05K 1/118* (2013.01); *H05K 3/388* (2013.01);
(Continued)

(58) Field of Classification Search
CPC ...... H05K 1/116; H05K 3/4688; H05K 3/429; H05K 3/388; H05K 1/118; H05K 1/028;
(Continued)

(56) References Cited

U.S. PATENT DOCUMENTS 4,781,969 A    11/1988  Kobayashi et al.
7,452,754 B2   11/2008  Hsu et al.
(Continued)

FOREIGN PATENT DOCUMENTS

JP    2007-123183 A    5/2007

OTHER PUBLICATIONS

International Search Report and Written Opinion of the International Searching Authority for International Patent Application No. PCT/US2017/059043 dated Feb. 14, 2018, 10 pages.

*Primary Examiner* — Ishwarbhai B Patel
(74) *Attorney, Agent, or Firm* — Merchant & Gould P.C.

(57) ABSTRACT

Flexible fingers for flexible printed circuits improve the crack resistance of prior art designs. The crack resistance can be improved by encapsulating the trace inside additional layers such that the outer two layers include only the lands of the through-hole, and all other copper is etched away. The crack resistance can also be improved with strategically adding copper on layers other than the trace layer including attaching is to the land of the through-hole as a stub. These two designs can be combined to include a stub trace into a four-layered design.

9 Claims, 9 Drawing Sheets

(51) Int. Cl.
*H05K 3/46* (2006.01)
*H05K 1/18* (2006.01)
*H05K 1/03* (2006.01)

(52) U.S. Cl.
CPC ........... *H05K 3/429* (2013.01); *H05K 3/4688* (2013.01); *H05K 1/0393* (2013.01); *H05K 1/189* (2013.01); *H05K 2201/09381* (2013.01); *H05K 2201/09454* (2013.01); *H05K 2201/09545* (2013.01)

(58) Field of Classification Search
CPC ......... H05K 2201/09381; H05K 2201/09545; H05K 2201/09454
See application file for complete search history.

(56) References Cited

U.S. PATENT DOCUMENTS

| | | | |
|---|---|---|---|
| 8,101,266 B2 | 1/2012 | Lee et al. | |
| 8,287,992 B2 | 10/2012 | Chisaka | |
| 8,951,072 B2* | 2/2015 | Hashim | H01R 13/6461 439/676 |
| 8,961,238 B2 | 2/2015 | Fitzpatrick | |
| 8,963,012 B2 | 2/2015 | Uehara et al. | |
| 8,998,454 B2 | 4/2015 | Wang et al. | |
| 2003/0188886 A1* | 10/2003 | Fey | H05K 3/242 174/256 |
| 2007/0015417 A1* | 1/2007 | Caveney | H01R 13/6658 439/676 |
| 2012/0260501 A1 | 10/2012 | Li | |
| 2013/0062102 A1* | 3/2013 | Lee | H05K 1/0393 174/254 |
| 2014/0008107 A1 | 1/2014 | Lee et al. | |
| 2014/0043577 A1* | 2/2014 | Kim | H05K 1/11 349/150 |
| 2014/0073197 A1* | 3/2014 | Fitzpatrick | H01R 13/6461 439/676 |
| 2015/0047892 A1 | 2/2015 | Yang et al. | |
| 2015/0163909 A1 | 6/2015 | Li et al. | |
| 2016/0020500 A1* | 1/2016 | Matsuda | H01P 3/085 333/238 |

\* cited by examiner

FLEXIBLE PRINTED CIRCUIT TO MITIGATE CRACKING AT THROUGH-HOLES

CROSS-REFERENCE TO RELATED APPLICATION

This application is a National Stage Application of PCT/US2017/059043, filed on Oct. 30, 2017, which claims the benefit of U.S. Patent Application Ser. No. 62/415,076, filed on Oct. 31, 2016, the disclosures of which incorporated herein by reference in their entireties. To the extent appropriate, a claim of priority is made to each of the above disclosed applications.

TECHNICAL FIELD

The disclosure relates to flexible printed circuits. More specifically, this disclosure relates to improvements in flexible printed circuits to mitigate cracking near plated through-holes and methods.

BACKGROUND

Computers, fax machines, printers, and other electronic devices are routinely connected by communications cables to network equipment such as routers, switches, servers and the like. A computer may be connected to a network device using conventional communications plugs/jack connections. The computer is connected by a patch cord to a communications jack that is mounted in a wall plate. The patch cord includes a communications cable that contains a plurality of individual conductors (e.g., eight insulated copper wires) and first and second communications plugs that are attached to the respective ends of the cable. The first communications plug is inserted into a plug aperture of a communications jack that is provided in the computer, and the second communications plug is inserted into a plug aperture in the front side of the communications jack. The contacts or blades of the second communications plug are exposed through the slots of the top and front surfaces of the second communications plug and mate with respective jack wire contacts of the communications jack. The blades of the first communications plug similarly mate with the respective jack wire contacts of the communications jack that is provided in the computer.

Typical communications insert of a jack can include a flexible printed circuit. The flexible printed circuit can include a flexible finger, in which the finger may move independent of other fingers such that each finger may be depressed a different distance downwardly when the jack is mated with a communications plug.

FIGS. 1-3 show a prior art flexible finger 200 for a printed circuit. In FIGS. 1-3, the flexible finger includes a substrate 201 with first and second opposing surfaces. On the first opposing surface is a conductive layer of copper 202. On a portion of the second opposing surface of the substrate 201 is a copper layer 204. A through-hole 206 is formed through the copper layers 202, 204 and the substrate 201. The through-hole 206 is lined with a conductive plating 208. The through-hole 206 is for receiving a jack wire contact, which is a conductive contact structure of the jack that is mounted in or on a structure so as to extend into the plug aperture of the jack. Each jack wire contact is configured to mate with a blade or other contact structure of a communications plug that is received within the plug aperture of the jack. Along the top and bottom of the flexible circuit are film coverlays 210, 212.

As can be seen in FIG. 3, the prior art construction creates two problems if there is any bending stress near the through-hole 206. First, the solder mask or coverlay 210, 212 can create a stress concentration due to the change in the flexible printed circuit thickness shown at region 214. Second, the outside copper layers include some thickness of electroplated copper over the entire trace surface due to the need to plate the through-hole 206. Electroplated copper has a grain structure that is more prone to cracking than rolled-annealed copper. Additionally, finish plating is typically applied, and it may also be more prone to cracking.

Improvements are desired.

SUMMARY

To improve the prior art, a flexible finger for a flexible printed circuit is provided. The flexible finger includes a flexible multilayered construction defining a through-hole in the construction. The multilayered construction includes a flexible substrate having first and second opposing surfaces, a conductive trace on the first surface, an inner conductive layer on the second surface, a first film layer secured to and covering the conductive trace, a second film layer secured to and covering the inner conductive layer, a first conductive outer layer on the first film layer, a second conductive outer layer on the second film layer, and an externally exposed plating lining the through-hole and covering the first conductive layer and second conductive layer, the plating being limited to a region adjacent to the through-hole, the region having an outer periphery. The inner conductive layer, first conductive outer layer, and second conductive outer layer circumscribe the through-hole and do not extend beyond the outer periphery of the region of the plating. The conductive trace in the multilayered construction is the only functioning conductive trace.

In one or more embodiments, the flexible substrate, conductive trace, first film layer, and second film layer all extend beyond the outer periphery of the region.

Preferably, the first conductive outer layer is copper, and the second conductive outer layer is copper.

In some implementations, a first adhesive layer secures the first film layer to the conductive trace and flexible circuit, and a second adhesive layer secures the second film layer to the inner conductive layer and flexible substrate.

In one or more arrangements, the flexible substrate is a polyimide film.

In one or more embodiments, the first film layer and second film layer each is a polyimide film.

Preferably, the plating comprises copper.

In another arrangement, a flexible finger for a flexible printed circuit is provided. The flexible finger includes a flexible multilayered construction defining a through-hole in the construction. The multilayered construction includes a flexible substrate having first and second opposing surfaces, a conductive trace on the first surface, a conductive layer on the second surface, and plating lining the through-hole. The plating includes a first plating layer circumscribing the through-hole and covering the conductive trace and a second plating layer circumscribing the through-hole and covering the entire conductive layer. A first film coverlay covers a portion of the first plating layer and leaves the first plating layer exposed and uncovered at a region circumscribing the through-hole. A second film coverlay covers a portion of the second plating layer and leaves the second plating layer exposed and uncovered at the regions circumscribing the through-hole. The conductive trace and the multilayered construction is the only functioning conductive trace.

In some implementations, a first adhesive layer secures the first coverlay to the flexible substrate, and a second adhesive layer secures the second film coverlay to the flexible substrate.

In one or more embodiments, the first conductive trace is copper, and the conductive layer is copper.

Preferably, the flexible substrate is a polyimide film.

Preferably, the first film coverlay and second film coverlay each is a polyimide film.

Preferably, the plating comprises copper.

In another aspect, a flexible finger for a flexible printed circuit is provided. The flexible finger comprises a flexible multilayered construction defining a through-hole in the construction. The multilayered construction includes a flexible substrate having first and second opposing surfaces, a conductive trace on the first surface, an inner conductive layer on the second surface, a first film layer secured to and covering the conductive trace, a second film layer secured to an covering the inner conductive layer, a first conductive outer layer on the first film layer, a second conductive outer layer on the second film layer, and externally exposed plating lining the through-hole and covering the first conductive outer layer and second conductive outer layer, the plating being limited to a region adjacent to the through-hole, and the region having an outer periphery. The inner conductive layer, first conductive outer layer, and second conductive outer layer circumscribe the through-hole. The first conductive outer layer and second conductive outer layer do not extend beyond the outer periphery of the region of the plating. The conductive trace in the multilayered construction is the only functioning conductive trace.

Preferably, the inner conductive layer extends beyond the outer periphery of the region of the plating and only partially on the second surface of the flexible substrate.

In another aspect, a method for mitigating cracking of conductive traces of a flexible finger of a flexible printed circuit is provided. The method includes providing a flexible substrate having a conductive trace on a first surface and an inner conductive layer on a second surface, the flexible substrate, conductive trace, and inner conductive layer defining a through-hole. The method further includes covering the conductive trace with a first film layer; covering the inner conductive layer with a second film layer; providing a first conductive outer layer on the first film layer; providing a second conductive outer layer on the second film layer; and providing externally exposed plating to line the through-hole and cover the first conductive outer layer and second conductive outer layer, the plating being limited to a region adjacent to the through-hole, the region having an outer periphery. The inner conductive layer, first conductive outer layer, and second conductive outer layer circumscribe the through-hole and do not extend beyond the outer periphery of the region of the plating. The conductive trace in the multilayered construction is the only functioning conductive trace.

In another aspect, a method for mitigating cracking of conductive traces of a flexible finger of a flexible printed circuit includes providing a flexible substrate having a conductive trace on a first surface and a conductive layer on a second surface; the flexible substrate, first conductive trace, and conductive layer defining a through-hole. The method includes lining the through-hole with plating and includes a first plating layer circumscribing the through-hole and covering the conductive trace and a second plating layer circumscribing the through-hole and covering the entire conductive layer. The method includes covering a portion of the first plating layer with a first film coverlay and leaving the first plating layer exposed and uncovered at a region circumscribing the through-hole. The method includes covering a portion of the second plating layer with a second film coverlay and leaving the second plating layer exposed and uncovered at the region circumscribing the through-hole. The conductive trace in the multilayered construction is the only functioning conductive trace.

In another aspect, a method for mitigating cracking of conductive traces of a flexible finger of a flexible printed circuit includes providing a flexible substrate having a conductive trace on a first surface and an inner conductive layer on a second surface; providing a first film layer secured to and covering the conductive trace; providing a second film layer secured to and covering the inner conductive layer; providing a first conductive outer layer on the first film layer; and providing a second conductive outer layer on the second film layer. The flexible substrate, conductive trace, inner conductive layer, first film layer, second film layer, first conductive outer layer, and second conductive outer layer define a through-hole. The method further includes lining the through-hole with externally exposed plating and covering the first conductive outer layer and second conductive outer layer, the plating being limited to a region adjacent to the through-hole, the region having an outer periphery. The inner conductive layer, first conductive outer layer, and second conductive outer layer circumscribe the through-hole. The first conductive outer layer and second conductive outer layer do not extend beyond the outer periphery of the region of the plating. The conductive trace is the only functioning conductive trace in the flexible finger of the flexible printed circuit.

A variety of additional inventive aspects will be set forth in the description that follows. The inventive aspects can relate to individual features and to combinations of features. It is to be understood that both the forgoing general description and the following detailed description are exemplary and explanatory only and are not restrictive of the broad inventive concepts upon which the embodiments disclosed herein are based.

DETAILED DESCRIPTION

Figure 4:
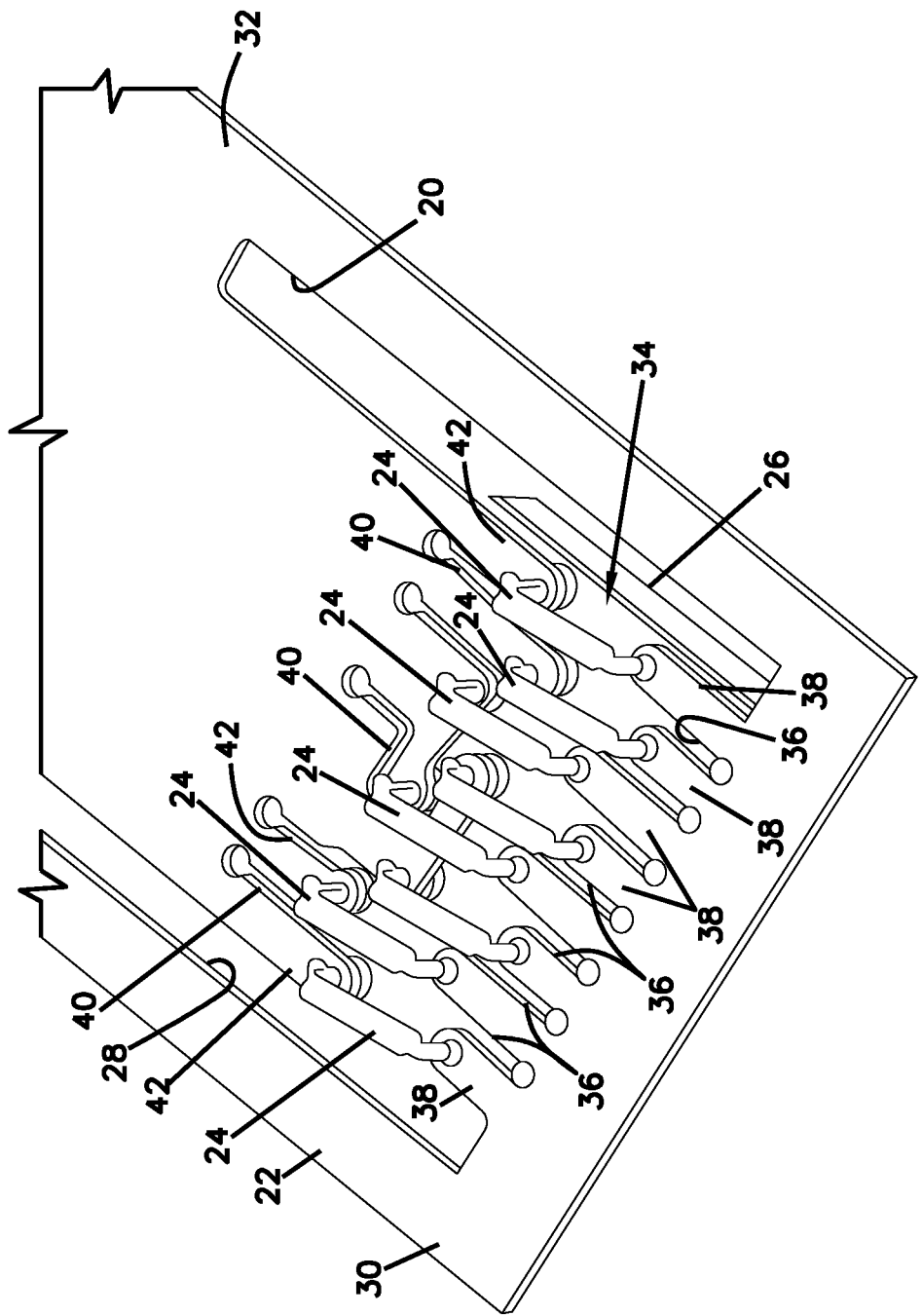
FIG. 4 is a schematic perspective view of a portion of a communications insert of a communications jack utilizing flexible fingers of a printed circuit, constructed in accordance with principles of this disclosure.

FIG. 4 illustrates a portion of a communications insert 20 for a communications jack. A forward portion 30 of the insert 20 is received within an opening in the jack. The insert 20 includes a flexible printed circuit 22, a plurality of jack prior contacts 24 and a plurality of dielectric contact carriers 26. The flexible printed circuit 22 may comprise an elongated printed circuit board that is formed of flexible material that may be bent in various ways. In the depicted embodiment, the flexible printed circuit 22 includes a pair of longitudinal slots 28 that decouple the front portion 30 of the flexible printed circuit 22 from a back portion 32.

The flexible printed circuit 22 includes a lateral slot 34 that extends between the pair of longitudinally extending slots 28. Additionally, a plurality of longitudinal slots 36 are provided in the front portion 30 of the flexible printed circuit 22 that define 8 rearwardly facing fingers 38. Likewise, 6 longitudinal slots 40 are provided in the back portion 32 of the flexible printed circuit 22 that define additional fingers 42.

The fingers 38 may move relatively independent of each other such that each finger 38 may be depressed a different distance downwardly when the jack is matted with a communications plug. Likewise, the fingers 42 may also move relatively independent of each other in this situation. The ability of the fingers 38-42 to move independent of other fingers may improve the performance and reliability of the jack.

The flexible printed circuit 22 includes one or more dielectric layers with at least one conductive trace. The flexible printed circuit 22 may be used as a transmission medium for signals that pass between the jack wire contacts 24 and respective output contacts of the jack. The flexible fingers 38 are improved over the prior art, as described further below.

Figure 5:
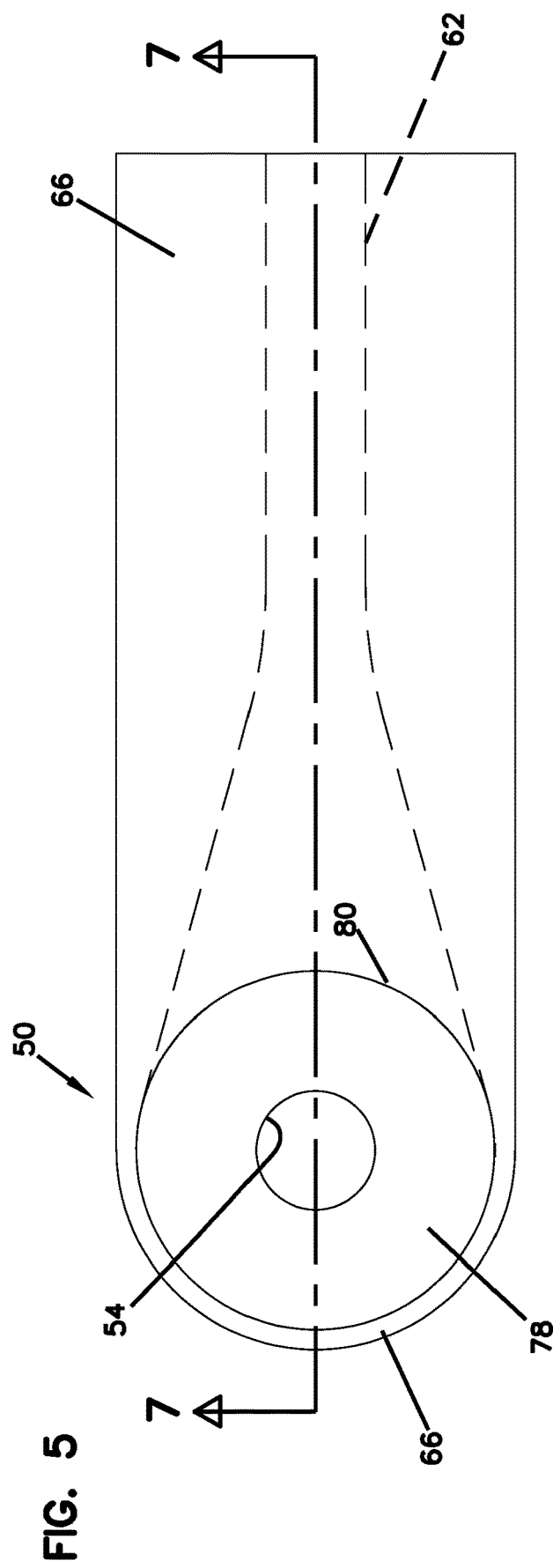
FIG. 5 is a top view of a flexible finger for a printed circuit, constructed in accordance with principles of this disclosure.
Figure 6:
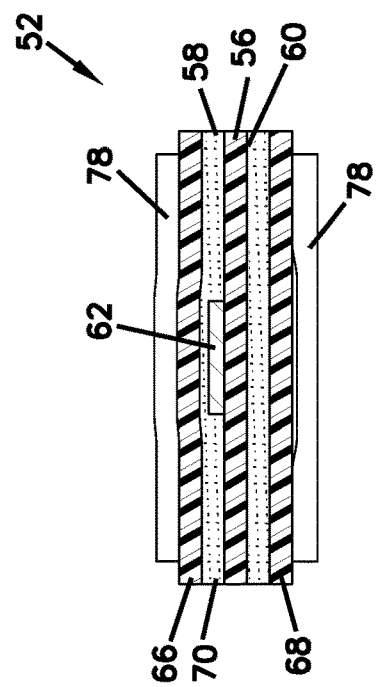
FIG. 6 is an end view of the flexible finger of FIG. 5.
Figure 7:
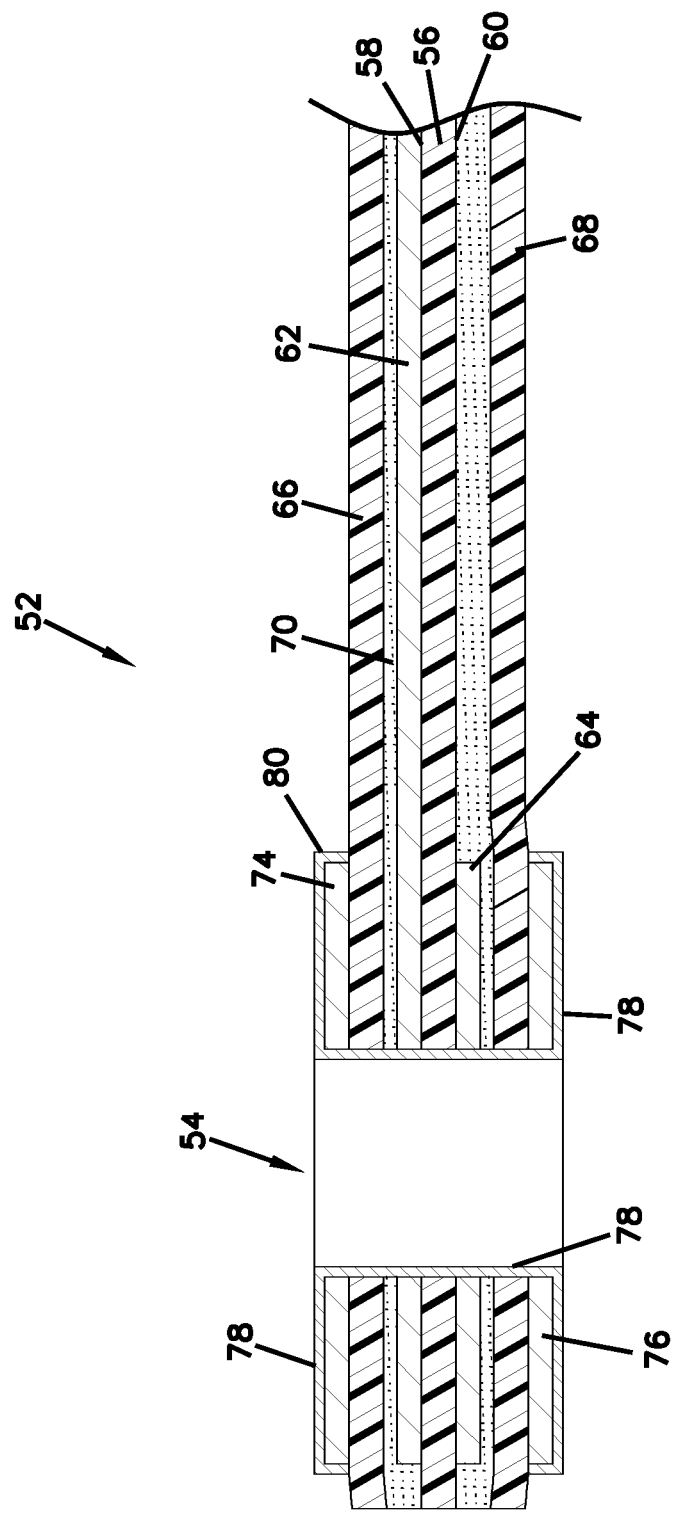
FIG. 7 is a cross-sectional view of the flexible finger of FIG. 5, the cross section being taken along the lines 7-7.

A first embodiment of an improved flexible finger for the flexible printed circuit 22 is shown in FIGS. 5-7 at reference numeral 50. In FIG. 7, the flexible finger 50 includes a flexible multilayered construction 52. The multilayered construction 52 defines a through-hole 54 in the construction 52. The multilayered construction 52 includes a flexible substrate 56. The flexible substrate 56 can be a variety of materials including, for example, polyimide. The flexible substrate 56 has a first surface 58 and a second surface 60. The first and second surfaces 58, 60 are on opposing sides of the flexible substrate 56.

Located on the first surface 58 is a conductive trace 62. The trace 62 is made by known techniques and comprises a continuous path of typically copper. In FIG. 5, the conductive trace 62 is shown in broken lines. The conductive trace 62 does not cover the entirety of the first surface 58 of the substrate 56; rather, the trace 62 extends from and around the hole 54 and away from the side edges of the substrate 56 along the finger 50. In preferred embodiments for the finger 50, the conductive trace 62 in the multi-layered construction 52 of the flexible finger 50 is the only functioning conductive trace.

There is an inner conductive layer 64 on the second surface 60 of the flexible substrate 56. The inner conductive layer 64 is typically copper. In the embodiment shown, it can be seen how the inner conductive layer 64 extends only along a partial extension of the second surface 60 of the flexible substrate 56. In the example shown, the inner conductive layer 64 circumscribes the through-hole 54 and does not extend much beyond the hole 54.

A first film layer 66 is secured to and covers the conductive trace 62. The first film layer 66 is illustrated as covering most, if not all, of the conductive trace 62. The first film layer 66 may be a variety of materials including, for example, polyimide film.

A second film layer 68 is secured to and covers the inner conductive layer 64. As the inner conductive layer 64 extends only a partial extension along the second surface 60 of the flexible substrate 56. The second film layer 68 also is secured to and covers the remaining portion of the second surface 60 of the flexible substrate 56. The second film layer 68 can be a variety of materials including, for example, polyimide film.

In preferred implementations, the first film layer 66 is secured to the conductive trace 62 and the flexible substrate 56 with a first adhesive layer 70. Similarly, a second adhesive layer 72 secures the second film layer 68 to the inner conductive layer 64 and a remaining portion of the second surface 60 of the flexible substrate 56.

A first conductive outer layer 74 is secured to the first film layer 66. As can be seen in FIG. 7, the first conductive outer layer 74 circumscribes the through-hole 54 and extends only a partial extension along the first film layer 66.

A second conductive outer layer 76 is on the second film layer 68. The second conductive outer layer 76 extends only along a partial extension of the second film layer 68. The second conductive outer layer circumscribes the through-hole 54. Preferably, each of the first conductive outer layer 74 and the second conductive outer layer 76 is made from copper.

In reference to FIG. 7, the multi-layered construction 52 includes externally exposed plating 78. The plating 78 lines the through-hole 54 and covers the first conductive outer layer 74 and second conductive outer layer 76. The plating 78 is limited to a region having an outer periphery 80 adjacent to the through-hole 54. In preferred implementations, the plating 78 comprises copper.

From a review of FIG. 7, it can be appreciated that the inner conductive layer 64, first conductive outer layer 74, and second conductive outer layer 76 circumscribe the through-hole 54 and do not extend beyond the outer periphery 80 of the plating 78. Further, it can be appreciated that the flexible substrate 56, conductive trace 62, first film layer 66, and second film layer 68 all extend beyond the outer periphery 80.

Figure 1:
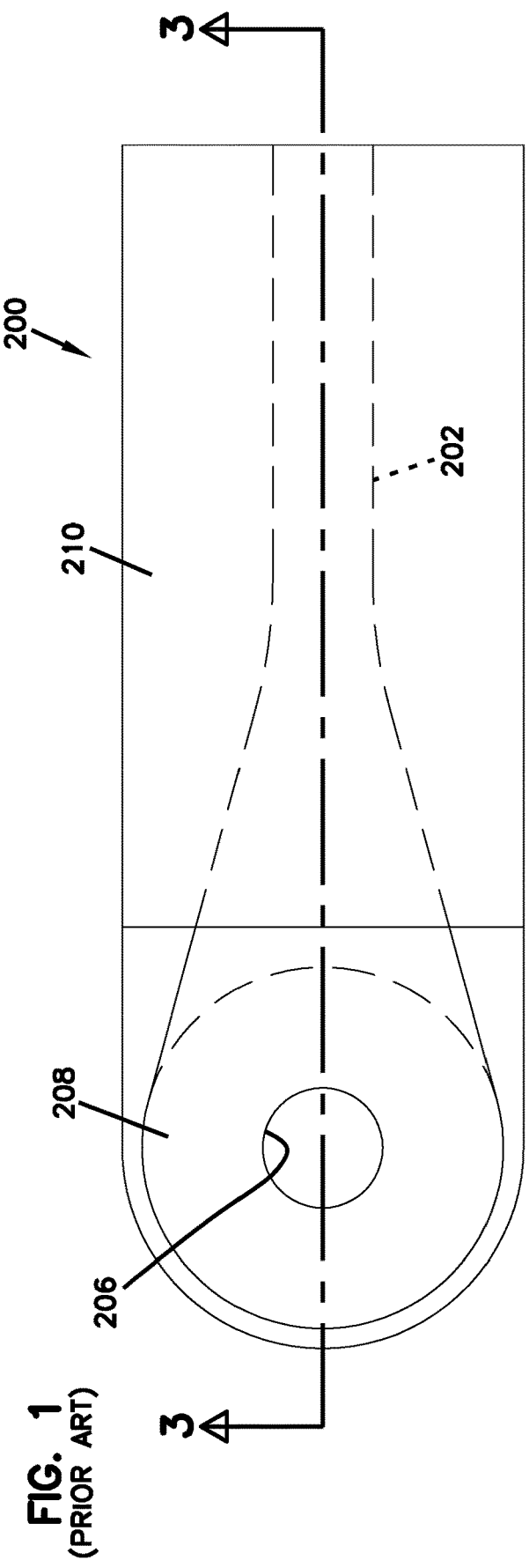
FIG. 1. is a top, schematic view of a prior art flexible finger for a printed circuit.

As compared to the prior art of FIG. 1, the embodiment of FIGS. 5-7 improves the crack resistance by encapsulating the trace 62 inside additional layers. The two outer layers include only the lands for the plated through-hole 54. All other copper is etched away. No solder mask is required, so the stress concentrations at its extents are eliminated. In addition, because traces are not on the outside layers, no copper or finish plating is added to the traces.

The embodiment of FIGS. 5-7 can be implemented as part of the method for mitigating cracking of conductive traces of a flexible finger of a flexible printed circuit. The method includes providing flexible substrate 56 having conductive trace 62 on the first surface 58 and an inner conductive layer 64 on the second surface 60. The flexible substrate 56, conductive trace 62, and inner conductive layer 64 define the through-hole 54.

The method can further include: covering the conductive trace 62 with first film layer 66; covering the inner conductive layer 64 with second film layer 68; providing first conductive outer layer 74 on the first film layer 66; providing second conductive outer layer 76 on the second film layer 68; and providing externally exposed plating 78 to line the through-hole 54 and cover the first conductive outer layer 74 and second conductive outer layer 76, the plating 78 being limited to a region adjacent to the through-hole 54 and having an outer periphery 80. The inner conductive layer 64, first conductive outer layer 74, and second conductive outer layer 76 circumscribe the through-hole 54 and do not extend beyond the outer periphery 80 of the plating 78. The conductive trace 62 in the multi-layered construction 52 is the only functioning conductive trace.

Figure 8:
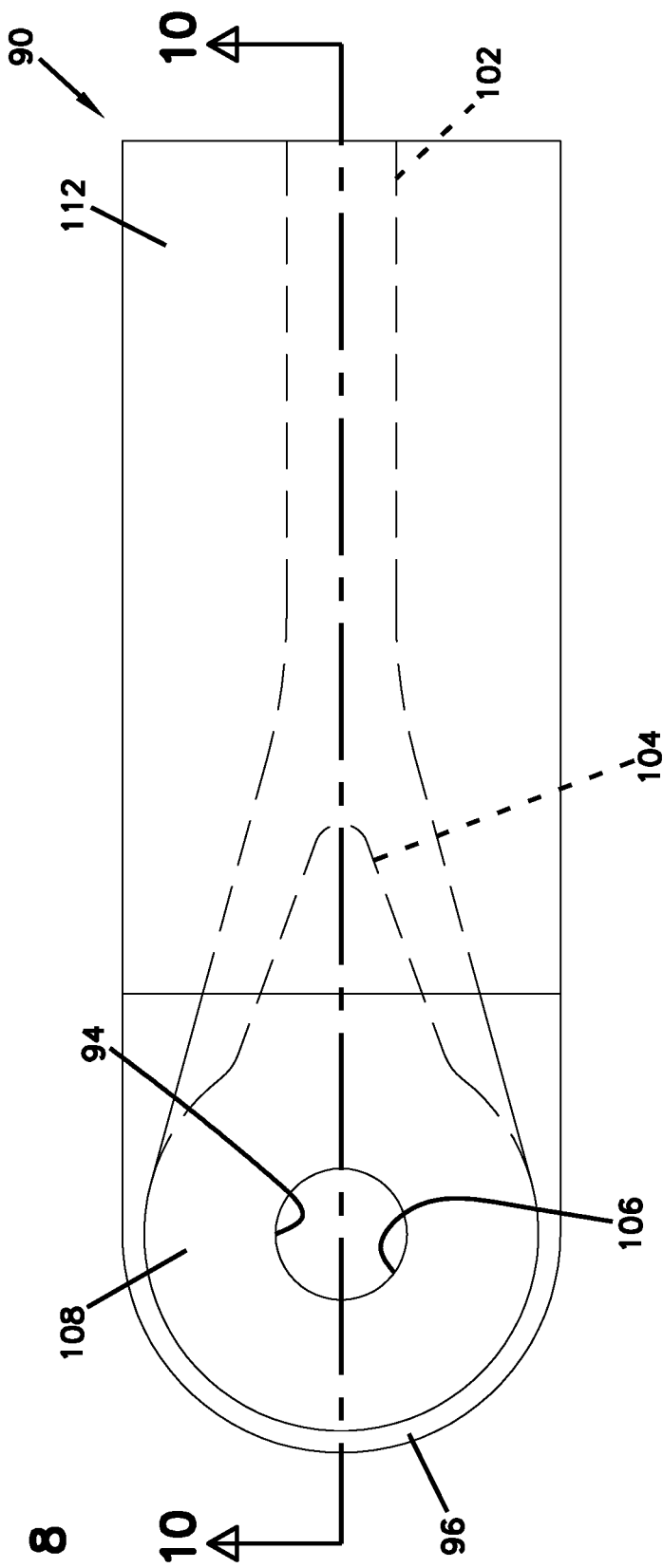
FIG. 8 is a top schematic view of another embodiment of a flexible finger for a printed circuit, constructed in accordance with principles of this disclosure.
Figure 9:
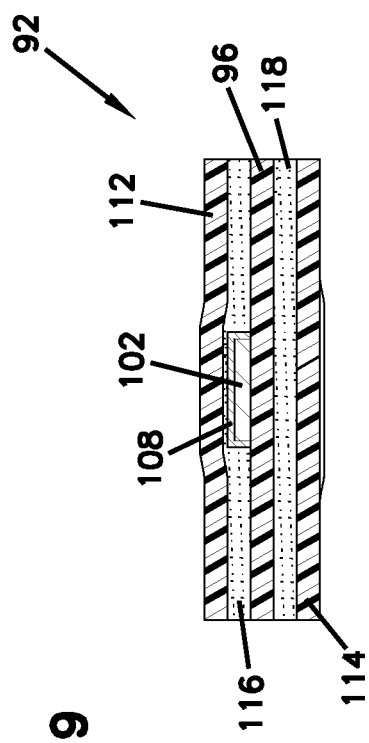
FIG. 9 is an end view of the flexible finger of FIG. 8.
Figure 10:
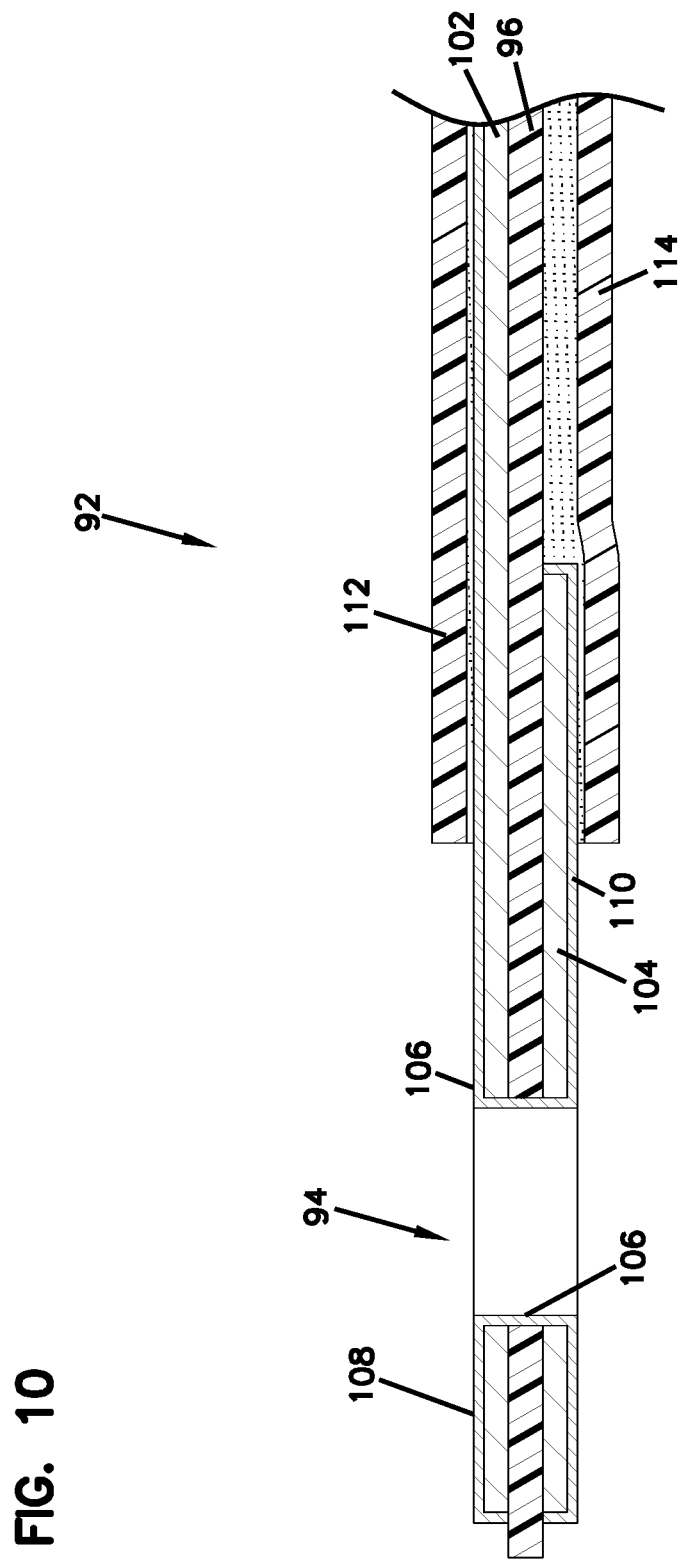
FIG. 10 is a cross-sectional view of the flexible finger of FIG. 8, the cross section being taken along the line 10-10 of FIG. 8.

Turning now to the embodiment of FIGS. 8-10, another embodiment for improving crack resistance of a flexible finger for a flexible printed circuit is provided. The flexible finger is shown at reference numeral 90 and includes a multi-layered construction 92. The multi-layered construction 92 defines a through-hole 94 in the construction 92.

A flexible substrate 96 is provided. The flexible substrate 96 has first and second opposing surfaces 98, 100. The flexible substrate 96 can be made from, for example, a polyimide film.

A conductive trace 102 is on the first surface 98 of the flexible substrate 96. The conductive trace 102 will typically be made from copper, for example. The conductive trace 102 is shown in broken lines in FIG. 8. The conductive trace 102 extends from the through-hole 94 along the flexible substrate 96, but is limited to a strip and does not extend to the full surface area of the first surface 98. In the multi-layered construction 92, preferably the only functioning conductive trace is the trace 102.

A conductive layer 104 is on the second surface 100 of the flexible substrate 96. As can be seen in FIG. 10, the conductive layer 104 extends only along a partial section of the second surface 100 of the flexible substrate 96. The conductive layer 104 circumscribes the through-hole 94 and extends from the through-hole 94 partially a distance along the second surface 100 of the flexible substrate 96. The conductive layer 104 is typically made of copper, for example.

An externally exposed plating 106 lines the through-hole 94. The plating 106 includes a first plating layer 108 circumscribing the through-hole 94 and covering the conductive trace 102. The plating 106 further includes a second plating layer 110 circumscribing the through-hole 94 and covering the entire conductive layer 104. Preferably, the plating comprises copper.

A first film coverlay 112 covers a portion of the first plating layer 108 and leaves the first plating layer 108 exposed and uncovered at a region circumscribing the through-hole 94. The first film coverlay 112 can be made from, for example, a polyimide film.

A second film coverlay 114 covers a portion of a second plating layer 110 and leaves the second plating layer 110 exposed and uncovered at the region circumscribing the through-hole 94. Typically, the second film coverlay 114 can be made of polyimide film.

Typically, a first adhesive layer 116 secures the first film coverlay 112 to the flexible substrate 96, while the second adhesive layer 118 secures the second film coverlay 114 to the flexible substrate 96.

Figure 2:
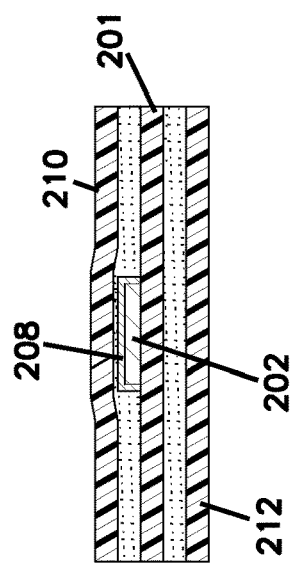
FIG. 2 is an end view of the prior art flexible finger of FIG. 1.
Figure 3:
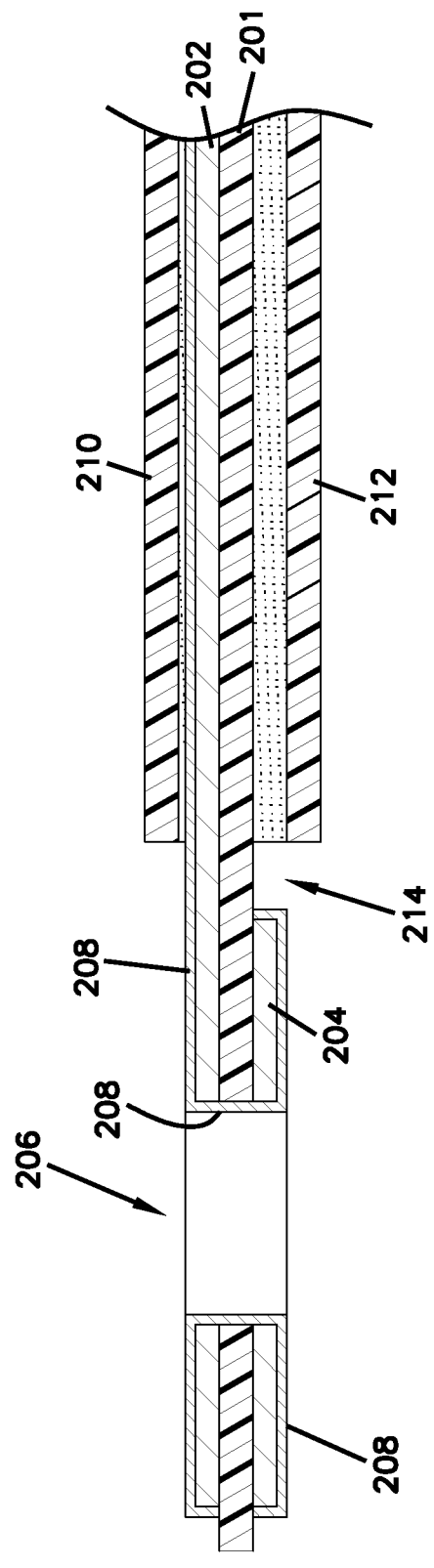
FIG. 3 is a cross-sectional view of the prior art flexible finger for a printed circuit, the cross-section being taken along the line 3-3 of FIG. 1.

From a review of FIGS. 8-10 and comparing this embodiment to the prior art embodiment of FIGS. 1-3, it can be appreciated how the stress concentrations are reduced by adding copper on layers other than the trace layer. For example, the conductive layer 104 is attached to the land of the through-hole 94 as a stub.

A method for mitigating cracking of conductive traces of a flexible finger of a flexible printed circuit may be practiced utilizing the embodiment of FIGS. 8-10. The method includes providing flexible substrate 96 having first conductive trace 102 on a first surface 98 and a conductive layer 102 on the second surface 100. The flexible substrate 96, conductive trace 102, and conductive layer 104 define the through-hole 94.

The method can include: lining the through-hole 94 with plating 106 and including the first plating layer 108 circumscribing the through-hole 94 and covering the conductive trace 102 and the second plating layer 110 circumscribing the through-hole 94 and covering the entire conductive layer 104; covering a portion of the first plating layer 108 with first film coverlay 112 and leaving the first plating layer 108 exposed and uncovered at a region circumscribing the through-hole 94; covering a portion of the second plating layer 110 with the second film coverlay 114 and leaving the second plating layer 110 exposed and uncovered at the region circumscribing the through-hole 94. The method would include providing the conductive trace 102 as the only functioning conductive trace in the multi-layered construction 92.

Figure 11:
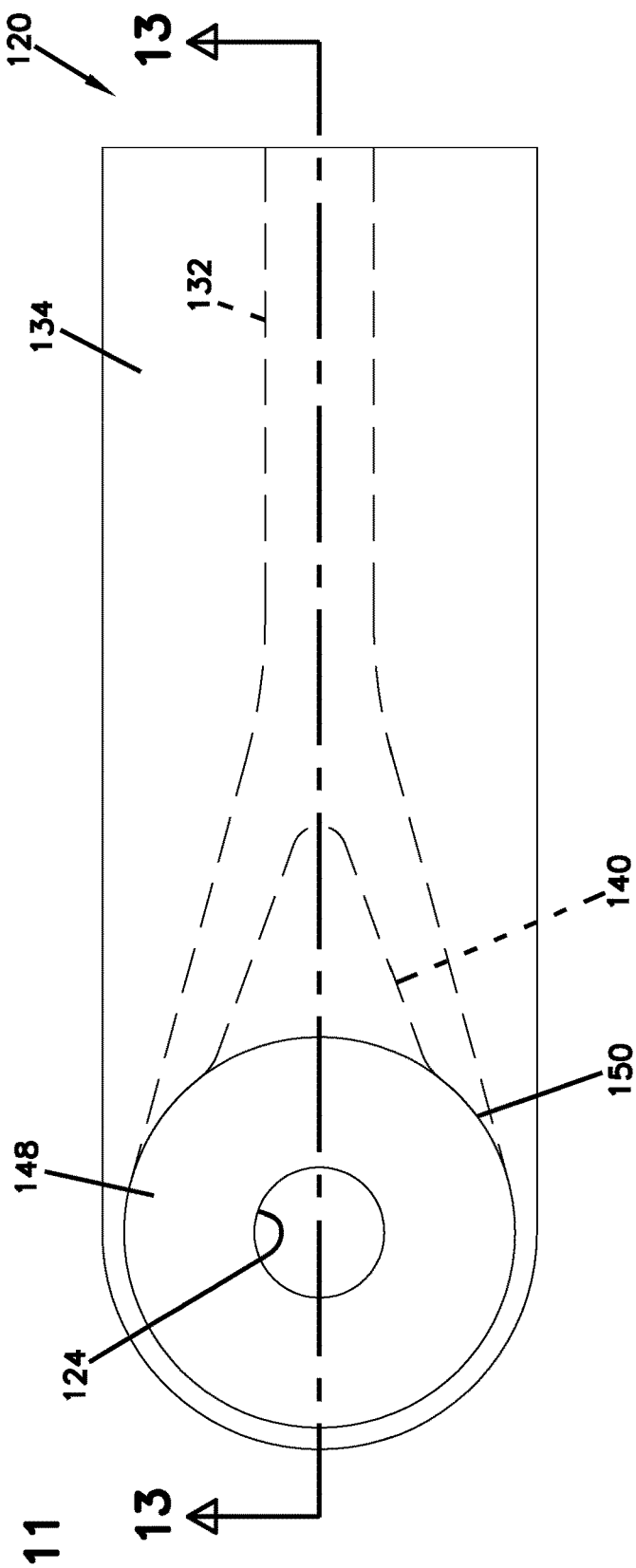
FIG. 11 is a top schematic view of another embodiment of a flexible finger for a printed circuit, constructed in accordance with principles of this disclosure.
Figure 12:
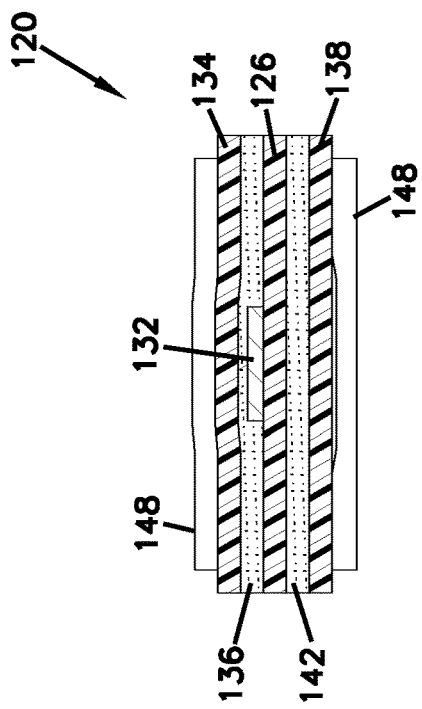
FIG. 12 is an end view of the flexible finger of FIG. 11.
Figure 13:
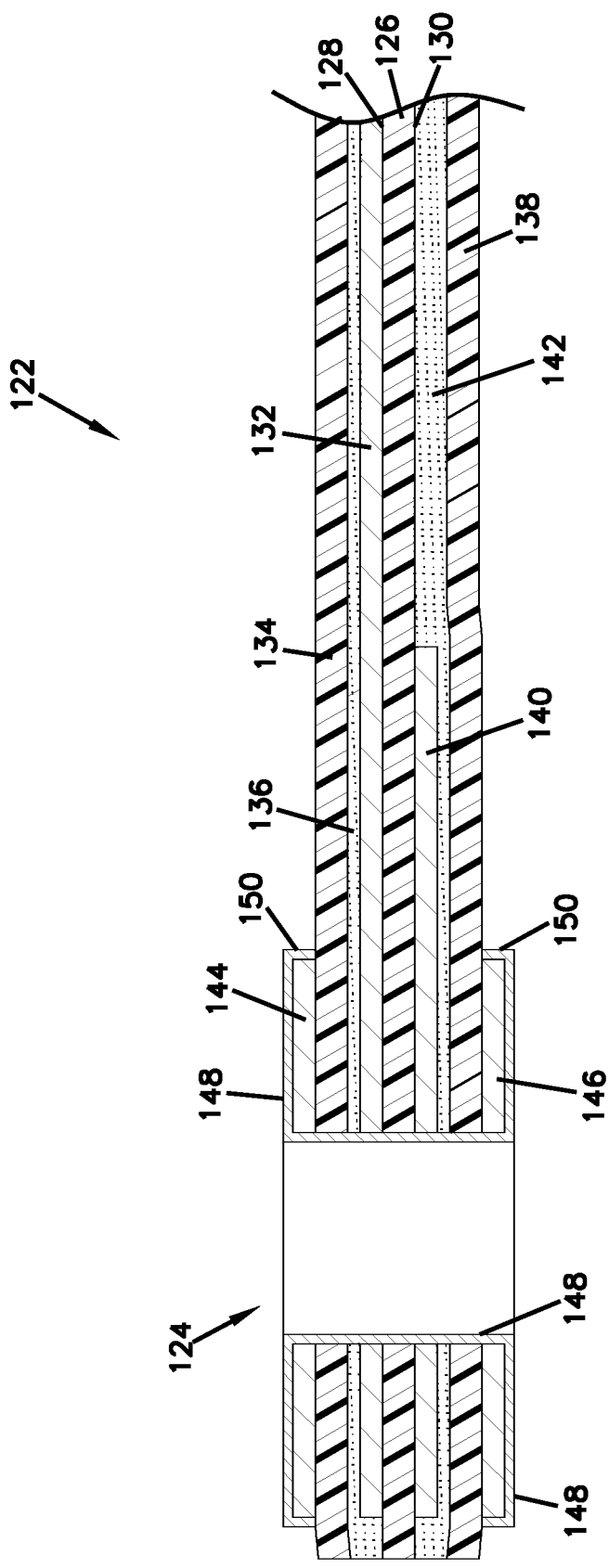
FIG. 13 is a cross-sectional view of the flexible finger of FIG. 11, the cross section being taken along the line 13-13 of FIG. 11.

In reference now to the embodiment of FIGS. 11-13, another solution for mitigating cracking of conductive traces of a flexible finger of a flexible printed circuit is provided. Flexible finger is shown at reference numeral 120. The flexible finger 120 includes a flexible multi-layered construction 122 defining a through-hole 124 in the construction 122.

The multi-layered construction 122 includes a flexible substrate 126 having first and second opposing surfaces 128, 130. The flexible substrate 126 will typically be made from a polyimide film.

A conductive trace 132 is on the first surface 128 of the flexible substrate 126. The conductive trace 132 will typically be made from copper. The conductive trace 132 will extend from around the through-hole 124 along the flexible substrate 126 but not to the far edges of the flexible substrate 126. The trace 132 can be seen in broken lines in FIG. 11.

A first film layer 134 is secured to and covers the conductive trace 132. The first film layer 134 can be made from a polyimide film and can be secured to the trace 132 with a first adhesive layer 136.

An inner conductive layer 140 is on the second surface 130 of the flexible substrate 126. From a review of FIG. 13, it can be seen how the inner conductive layer 140 circumscribes the through-hole 124 and extends partially along the second surface 130 of the flexible substrate 126. The inner conductive layer 140 does not extend the entire length of the substrate 126. The inner conductive layer 140 can be seen in broken lines in FIG. 11. The inner conductive layer 140 is preferably made from copper.

A second film layer 138 is secured to and covers the inner conductive layer 140. The second film layer 138 circumscribes the through-hole 124, covers the entirety of the inner conductive layer 140, and a remaining portion covers the second surface 130 of the flexible substrate 126. A second adhesive layer 142 can be used to secure the second film layer 138 to the inner conductive layer 140 and the flexible substrate 126. Typically, the second film layer 138 will be a polyimide film.

A first conductive outer layer 144 is on the first film layer 134. The first conductive outer layer 144 circumscribes the through-hole 124 and extends only partially along the first film layer 134. The first conductive outer layer 144 is typically made from copper.

A second conductive outer layer 146 is on the second film layer 138. The second conductive outer layer 146 circumscribes the through-hole 124 and extends only partially along the second film layer 138. Typically, the second conductive outer layer 146 is made from copper.

Externally exposed plating 148 lines the through-hole 124 and covers the first conductive outer layer 144 and second conductive outer layer 146. The plating 148 is limited to a region adjacent to the through-hole 124. The region has an outer periphery 150.

From a review of FIG. 13, it can be appreciated that the inner conductive layer 140, first conductive outer layer 144, and second conductive outer layer 146 circumscribe the through-hole 124. The first conductive outer layer 144 and second conductive outer layer 146 do not extend beyond the outer periphery 150 of the plating 148. Further, the conductive trace 132 in the multi-layered construction 122 is the only functioning conductive trace.

Further, from a review of FIG. 13, it can be appreciated that the inner conductive layer 140 extends beyond the outer periphery 150 and only partially along the second surface 130 of the flexible substrate 126.

The embodiment of FIGS. 11-13 combines the concepts of the embodiments of FIGS. 5-7 and 8-10. Basically, the stub trace of the embodiment of FIGS. 8-10 is incorporated into a four-layer design of FIGS. 5-7. The result is the flexible finger that improves the prior art by being resistant to cracking.

The embodiment of FIGS. 11-13 can be used in a method for mitigating cracking of conductive traces of a flexible finger of a flexible printed circuit. The method includes providing flexible substrate 126 having conductive trace 132 on first surface 128 and inner conductive layer 140 on second surface 130. The method includes: providing first film layer 134 secured to and covering the conductive trace 132; providing second film layer 138 secured to and covering the inner conductive layer 140; providing first conductive outer layer 144 on the first film layer 134; and providing second conductive outer layer 146 on the second film layer 138. The flexible substrate 126, conductive trace 132, inner conductive layer 140, first film layer 134, second film layer 138, first conductive outer layer 144, and second conductive outer layer 146 define the through-hole 124.

Next, the method can include aligning the through-hole 124 with externally exposed plating 148 and covering the first conductive outer layer 144 and second conductive outer layer 146. The plating is limited to a region adjacent to the through-hole 124 and has an outer periphery 150. The inner conductive layer 140, first conductive outer layer 144, and second conductive outer layer 146 circumscribes the through-hole 124. The first conductive outer layer 144 and second conductive outer layer 146 do not extend beyond the outer periphery 150 of the region of the plating 148. The conductive trace 132 in the multi-layered construction 122 is the only functioning conductive trace.

The above represents example principles. Many embodiments can be made applying these principles.

What is claimed is:

1. A flexible finger for a flexible printed circuit; the flexible finger comprising:
   (a) a flexible multi-layered construction defining a through-hole in the construction;
   the multi-layered construction including,
   (i) a flexible substrate having first and second opposing surfaces;
   (ii) a conductive trace on the first surface;
   (iii) an inner conductive layer on the second surface;
   (iv) a first film layer secured to and covering the conductive trace;
   (v) a second film layer secured to and covering the inner conductive layer;
   (vi) a first conductive outer layer on the first film layer;
   (vii) a second conductive outer layer on the second film layer; and
   (viii) externally exposed plating lining the through-hole and covering the first conductive outer layer and second conductive outer layer; the plating being limited to a region adjacent to the through-hole, the region having an outer periphery; and
   wherein the inner conductive layer, first conductive outer layer, and second conductive outer layer circumscribe the through-hole;
   wherein the first conductive outer layer and second conductive outer layer do not extend beyond the outer periphery of the region of the plating; and
   wherein the conductive trace in the multi-layered construction is the only functioning conductive trace.

2. The flexible finger of claim 1 wherein the flexible substrate, conductive trace, first film layer, and second film layer all extend beyond the outer periphery of the region.

3. The flexible finger of claim 1 wherein:
   (a) the first conductive outer layer is copper; and
   (b) the second conductive outer layer is copper.

4. The flexible finger of claim 1 wherein:
   (a) a first adhesive layer secures the first film layer to the conductive trace and flexible substrate; and
   (b) a second adhesive layer secures the second film layer to the inner conductive layer and flexible substrate.

5. The flexible finger of claim 1 wherein the flexible substrate is a polyimide film.

6. The flexible finger of claim 1 wherein the first film layer, and second film layer each is a polyimide film.

7. The flexible finger of claim 1 wherein the plating comprises copper.

8. The flexible finger of claim 1 wherein the inner conductive layer extends beyond the outer periphery of the region of the plating and only partially on the second surface of the flexible substrate.

9. The flexible finger of claim 1 wherein the inner conductive layer does not extend beyond the outer periphery of the region of the plating.

* * * * *